(12) United States Patent
Kim et al.

(10) Patent No.: US 7,902,001 B2
(45) Date of Patent: Mar. 8, 2011

(54) METHOD OF FABRICATING THIN FILM DEVICE

(75) Inventors: Sang Jin Kim, Gyunggi-do (KR); Yongsoo Oh, Gyunggi-do (KR); Hwan-Soo Lee, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 12/479,298

(22) Filed: Jun. 5, 2009

(65) Prior Publication Data

US 2010/0120232 A1    May 13, 2010

(30) Foreign Application Priority Data

Nov. 13, 2008    (KR) ................ 10-2008-0112955

(51) Int. Cl.
*H01L 21/00* (2006.01)
*H01L 21/84* (2006.01)

(52) U.S. Cl. .... 438/149; 438/706; 438/780; 257/E21.17; 257/E21.007; 257/E21.051; 257/E21.077; 257/E21.134; 257/E21.229; 257/E21.245; 257/E21.25; 257/E21.252; 257/E21.266; 257/E21.293

(58) Field of Classification Search ................ 438/149, 438/459, 463, 660, 663, 680, 684, 706, 719, 438/724, 744, 757, 780; 257/E21.17, 7, 51, 257/77, 134, 229, 245, 25, 252, 266, 293, 257/329, 347

See application file for complete search history.

(56) References Cited

U.S. PATENT DOCUMENTS

| | | | |
|---|---|---|---|
| 7,425,749 B2 * | 9/2008 | Hartzell et al. | 257/414 |
| 7,560,789 B2 | 7/2009 | Izumi et al. | |
| 7,687,372 B2 * | 3/2010 | Jain | 438/455 |
| 2006/0246267 A1 * | 11/2006 | Jain | 428/195.1 |
| 2007/0196999 A1 | 8/2007 | Tamura et al. | |
| 2008/0202365 A1 | 8/2008 | Schneider et al. | |

FOREIGN PATENT DOCUMENTS

| | | |
|---|---|---|
| KR | 10-2006-0122751 A | 11/2006 |
| KR | 10-2007-0058458 A | 6/2007 |
| KR | 10-2007-0085112 A | 8/2007 |
| KR | 10-0798431 B1 | 1/2008 |

OTHER PUBLICATIONS

Korean Office Action, w/ English translation thereof, issued in Korean Patent Application No. KR 10-2008-0112955 dated Aug. 25, 2010.

* cited by examiner

*Primary Examiner* — David Nhu
(74) *Attorney, Agent, or Firm* — McDermott Will & Emery LLP

(57) ABSTRACT

Provided is a sacrifice layer formed on a first substrate. A thin film laminated body is formed on the sacrifice layer. A separation groove exposing the sacrifice layer is formed to divide the thin film laminated body into at least one thin film device. The sacrifice layer is partially removed using a dry etching process. After the partial removal of the sacrifice layer, a remaining sacrifice layer region maintains the thin film device on the first substrate. A supporting structure is temporarily joined to the thin film device. The thin film device joined to the supporting structure is separated from the first substrate. Then, the remaining sacrifice layer is removed. The thin film device joined to the supporting structure is joined to a second substrate. Finally, the supporting structure is separated from the thin film device.

14 Claims, 3 Drawing Sheets

METHOD OF FABRICATING THIN FILM DEVICE

CROSS-REFERENCE TO RELATED APPLICATIONS

This application claims the priority of Korean Patent Application No. 2008-112955 filed on Nov. 13, 2008 in the Korean Intellectual Property Office, the disclosure of which is incorporated herein by reference.

BACKGROUND OF THE INVENTION

1. Field of the Invention

The present invention relates to a method of fabricating a thin film device, and more particularly, to a method of fabricating a thin film device using a thin film transcription process that can be used as a technology of fabricating a flexible device.

2. Description of the Related Art

In general,thin film transcription technology has been widely used in a thin film transistor (TFT), an electronic device and an optical device such as an organic electroluminescent (EL) device.

The thin film transcription technology refers to a technology of fabricating a desired thin film device by transcribing a necessary thin film formed in the preliminary substrate to a permanent substrate. This thin film transcription technology can be efficiently used when the condition of a substrate used to form a film is different from the condition of a substrate used for a thin film device.

For example, the thin film transcription technology can be beneficially used when a substrate used for a device has a low heat-resisting property or low softening point and melting points even though a relatively high temperature process is required in a semiconductor film formation technology. Specifically, the thin film transcription technology can also be beneficially used in a flexible thin film device.

Since a related art flexible device requires flexibility, an organic substrate such as a polymer has been mainly used and an organic thin film has been used as a thin film forming a function unit on the surface of the organic substrate. However, because it is difficult to ensure high performance of the function unit implemented by the organic thin film, the function unit of the flexible device needs to be formed of an inorganic matter such as a poly-silicon or an oxide. In this case, because a high temperature semiconductor film formation technology is difficult to directly apply to a flexible organic substrate, the thin film transcription technology is used to transcribe a thin film formed of an inorganic matter such as a semiconductor to other preliminary substrate.

However, in the thin film transcription technology, a surface separated from a preliminary substrate is provided on the upper surface of a thin film transcribed to a permanent substrate. Also, a residue of a sacrifice layer may remain on the upper surface of the thin film. Accordingly, a removal process of the residue of the sacrifice layer is necessary to prevent a harmful effect on the thin film device.

On the other hand, a laser irradiation or a wet etching process may be used in a process of removing the sacrifice layer. In the case of the laser irradiation, a thin film device may be damaged by a laser output during the laser irradiation.

Moreover, in the case of the wet etching process, a structure of the thin film may be adhered to a substrate, and a relatively low etching selectivity may cause an inconvenience of requiring a separate photoresist process to protect a thin film device region.

SUMMARY OF THE INVENTION

An aspect of the present invention provides a method of fabricating a thin film device that can simplify the entire process and minimize the property variation of the thin film device during a transcription.

According to another aspect of the present invention, there is provided a method of fabricating a thin film device, including: forming a sacrifice layer on a first substrate; forming a thin film laminated body on the sacrifice layer; forming a separation groove exposing the sacrifice layer to divide the thin film laminated body into at least one thin film device; partially removing the sacrifice layer using a dry etching process, a remaining sacrifice layer region after the partial removal of the sacrifice layer maintaining the thin film device on the first substrate; temporarily joining a supporting structure to the thin film device; separating the thin film device joined to the supporting structure from the first substrate, the remaining sacrifice layer being removed; joining the thin film device joined to the supporting structure to a second substrate; and separating the supporting structure from the thin film device.

The sacrifice layer may be formed of amorphous silicon. In this case, the dry etching process may be performed using a $Xe_2F$ gas as an etchant.

The method may further include forming an insulating layer on the upper surface of the first substrate to protect the first substrate before the forming of the sacrifice layer. The method may further include forming an insulating layer on the sacrifice layer to support the thin film device before the forming of the thin film laminated body. In this case, the insulating layer may include an oxide or a nitride.

The temporary joining of the supporting structure may include pressing the supporting structure on the thin film device to temporarily join the surface of the supporting structure to the surface of the thin film device. In this case, the supporting structure may be formed of a poly dimethyl siloxane (PDMS)-based or a silicon rubber-based polymer.

The separating of the thin film device may include irradiating a laser to decompose the remaining sacrifice layer region. Otherwise, the separating of the thin film device may include applying a physical force to break the remaining sacrifice layer region to separate the thin film device from the first substrate.

The joining of the thin film device may include using a junction material layer to join the thin film device to the second substrate.

The second substrate may include a flexible substrate. The thin film device may include a thin film transistor (TFT), a solar cell, or a biosensor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
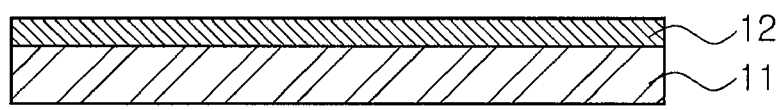
FIGS. 1A to 1C are cross-sectional views illustrating a process of forming a transcription target in a method of fabricating a thin film device according to an embodiment of the present invention.
Figure 1B:
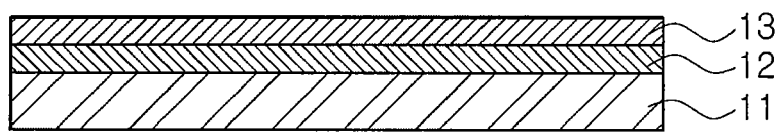
Figure 1C:
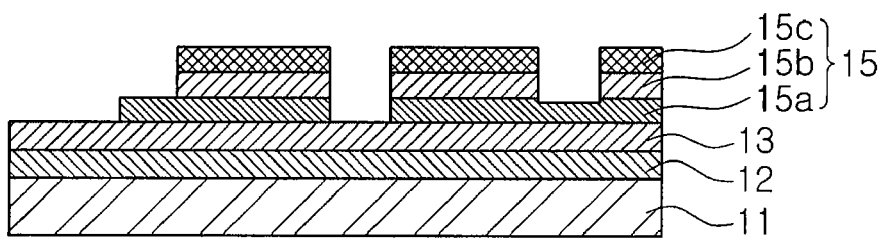

FIGS. 1A to 1C are cross-sectional views illustrating a process of forming a transcription target in a method of fabricating a thin film device according to an embodiment of the present invention.

As described in FIG. 1A, a first substrate 11 is prepared. An insulating layer 12 may be additionally formed to protect the first substrate 11 in a process of removing a subsequent sacrifice layer on the upper surface of the first substrate 11. The insulating layer 12 is formed of an oxide such as $SiO_2$ or a nitride such as $SiN_x$.

The first substrate 11 may be a substrate suitable to form a thin film for forming a specific functional device. For example, a desired thin film is a semiconductor or a metal, a high temperature film formation process is generally necessary to grow the semiconductor or the metal. Accordingly, the thin film is formed of a material having a heat-resisting property and satisfying growth surface conditions.

For example, when a laser lift-off process is used at a separation process of a thin film device, a selection of the material of the first substrate 11 is additionally required. That is, the first substrate 11 maybe formed of a material having a greater band gap than an energy corresponding to a wavelength of the laser beam, in order for the laser to transmit the first substrate 11. The first substrate 11 may be a transparent substrate, and include, but not limited to, sapphire, quartz, glass, oxidation magnesium (MgO), lanthanum aluminate ($LaAlO_3$), fused silica, or zirconia.

As described in FIG. 1B, a sacrifice layer 13 is formed on the insulating layer 12 formed on the first substrate 11.

The sacrifice layer 13 according to an embodiment of the present invention may include a material that can be highly-selectively etched with respect to a material forming the thin film device. Amorphous silicon ($\alpha$-Si) may be used as the sacrifice layer 13. The amorphous silicon is easily etched by a XeF2 gas with high selectivity with respect to a typical semiconductor material and an electrode material.

Additionally, the sacrifice layer 13, as occasion demands, may be a material that can be decomposed by a laser. This corresponds to a case where a part of remaining region needs to be removed by the laser through a subsequent process.

Next, as described in FIG. 1C, at least one thin film device 15 may be formed on the sacrifice layer 13.

The thin film device 15 may be formed of an inorganic matter such as a semiconductor or a poly-silicon, or a metal. In order to form layers (15a, 15b and 15c) of the thin film device 15, a known film formation method such as sputtering, evaporation, CVD may be used. In order to form a device region, a selective etching process using lithography may be used. As described in this process, the sacrifice layer 13 is partially exposed so as to be dry-etched in a process of forming a separation groove for dividing the device region.

Through these processes, a thin film device, a transcription target, necessary for a method of fabricating the thin film device according to an embodiment of the present invention can be prepared. The thin film device 15 used in an embodiment of the present invention may be a thin film transistor (TFT), a solar cell, or a biosensor. FIGS. 2A to 2D are cross-sectional views illustrating a process of forming the thin film device in FIG. 1C.

Figure 2A:
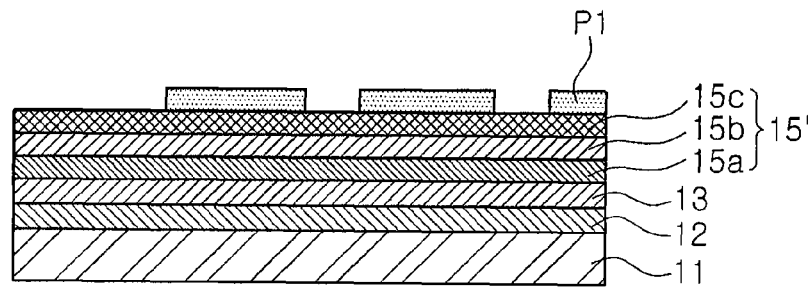
FIGS. 2A to 2D are cross-sectional views illustrating a process of forming the thin film device in FIG. 1C.

As described in FIG. 2A, a thin film laminated body 15' having a lower electrode 15a, a piezoelectric layer 15b and an upper electrode 15c sequentially stacked thereon is provided on the sacrifice layer 13. In addition, a first photoresist pattern P1 is formed on the thin film laminated body 15'.

The lower electrode 15a may be formed by depositing a Ti/PT layer using a sputter. The piezoelectric layer 15b may be coated through a sol-gel method. The upper electrode 15c is formed by depositing Pt using the sputter. Next, the photoresist pattern P1 is formed to expose a region of the upper electrode 15c and the piezoelectric layer 15b to be removed.

Although not described in this embodiment, an insulating layer (not shown), on occasion demands, maybe formed to form a device for forming the lower electrode 15a.

Figure 2B:
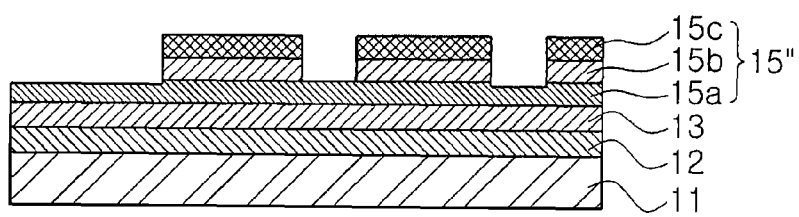

As described in FIG. 2B, the upper electrode 15c and a piezoelectric layer 15b are selectively removed using the first photoresist pattern P1. This removal process may be performed through a dry etching process using an etchant gas having a low etch rate with respect to a material forming the lower electrode 15a.

Figure 2C:
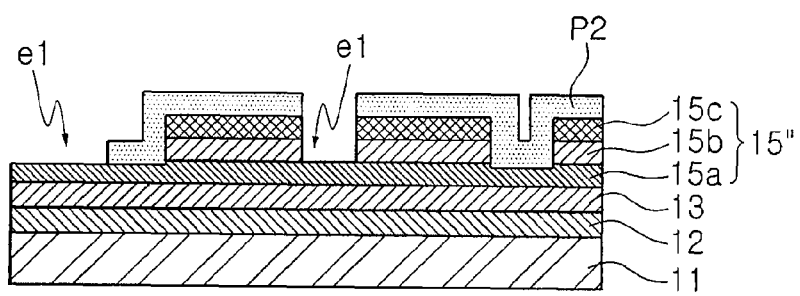
Figure 2D:
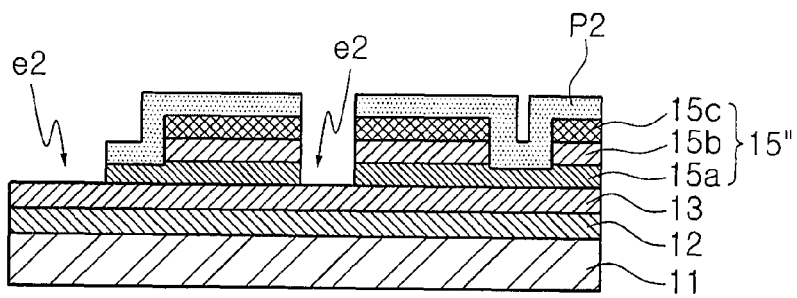

Next, as described in FIG. 2C, a second photoresist pattern P2 is formed to expose a region of the lower electrode 15a to be removed. Then, the lower electrode 15a is selectively removed through the dry etching process. Through this removal process of the lower electrode 15a, a plurality of thin film devices 15 can be formed, and also, an exposed region e2 of the sacrifice layer 13 can be provided.

FIGS. 3A to 3E, are cross-section views illustrating a transcription process of a transcription target in a method of fabricating a thin film device according to an embodiment of the present invention.

Figure 3A:
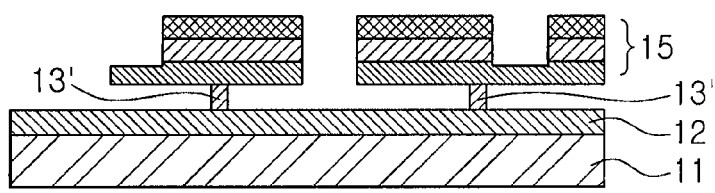
FIGS. 3A to 3E, are cross-section views illustrating a transcription process of a transcription target in a method of fabricating a thin film device according to an embodiment of the present invention.

As described in FIG. 3A, the sacrifice layer 13 is partially removed using the dry etching process to remain the remaining sacrifice layer region 13'.

The remaining sacrifice layer region 13' can maintain the thin film device 15 on the first substrate 11 in a subsequent process. More specifically, the remaining sacrifice layer region 13' maintains the thin film device 15 on the first substrate 11 during performing a temporary junction process (see FIG. 3B) of a supporting structure 17, and allows the thin film device 15 to be readily removed from the first substrate 11 through a separation process (see FIG. 3C).

As described above, the etch process is used in this embodiment. If amorphous silicon ($\alpha$-Si) is used as the sacrifice layer 13, the amorphous silicon is easily etched by a XeF2 gas with high selectivity with respect to a typical semiconductor material and an electrode material. In this case, the high selectivity serves to stably protect the thin film device 15, and also overcome a limitation in that the thin film device 15 is adhered to the first substrate 11 in a related art wet etching process.

Figure 3B:
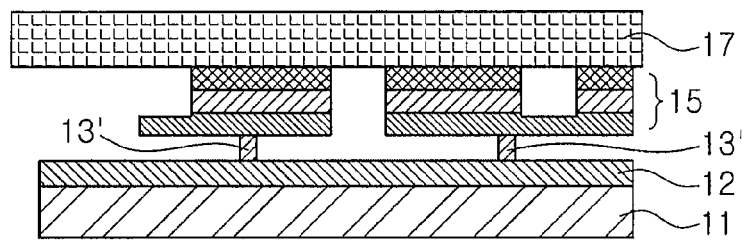

As described in FIG. 3B, the supporting structure 17 is temporarily joined to the thin film device 15.

The supporting structure 17 is a temporary supporting structure used until the thin film device 15 is transcribed to a second substrate (a permanent substrate). It can be understood that the term, "temporary junction" refers to a weaker junction status than junction strength of the second substrate to be transcribed while maintaining junction strength capable of maintaining/treating the thin film device 15 at least until a transcription process.

That is, "temporary junction" process refers to a junction not using an additional means such as an adhesive, or a fusion welding through a high-temperature heat treatment process. As an exemplary embodiment, the temporary junction may be a status that smooth surfaces of the thin film device 15 and the supporting structure 17 are temporarily joined to each other by van der Waals forces. This temporary junction process can be performed enough even under low pressure at a room temperature.

Accordingly, the supporting structure 17 can be readily separated from the thin film device 15 after the thin film device 15 is transcribed to the second substrate. Also, clean status of a separated surface can be ensured even after the supporting structure 17 is separated.

In order to readily implement the temporary junction using van der Waals forces, the supporting structure 17 may be formed of a material such as a poly dimethyl siloxane (PDMS) or a silicon rubber-based polymer. It will be understood that, without being limited to such a material, any material facilitating the above-described temporary junction through a similar interfacial interaction may be used instead.

The present invention, without being limited to the above-described temporary junctions, may use other additional means such as an adhesive that can provide weak junction strength necessary for a transcription.

Figure 3C:
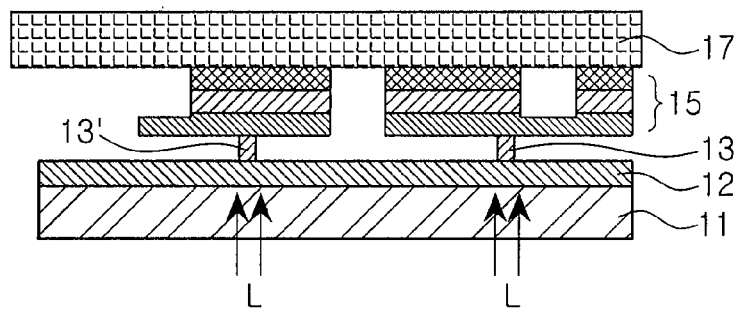

As described in FIG. 3C, a thin film device 15 joined to the supporting structure 17 is separated from the first substrate 11.

The remaining sacrifice layer region 13' can be removed during this process. According to an embodiment of the present invention, the remaining sacrifice layer region 13' is removed using a laser (L) such that the thin film device 15 is completely separated from the first substrate 11. Since most sacrifice layer 13 is removed through the previous dry etching process, a laser (L) irradiation is required on a very small area of remaining sacrifice layer region 13' in this process. Accordingly, a damage possibility of the thin film device 15 by the laser (L) irradiation may be significantly reduced.

Unlike this, without the additional removal process, the remaining sacrifice layer region 13' may be mechanically removed by separating the thin film device 15 from the first substrate 11 using a physical force.

Figure 3D:
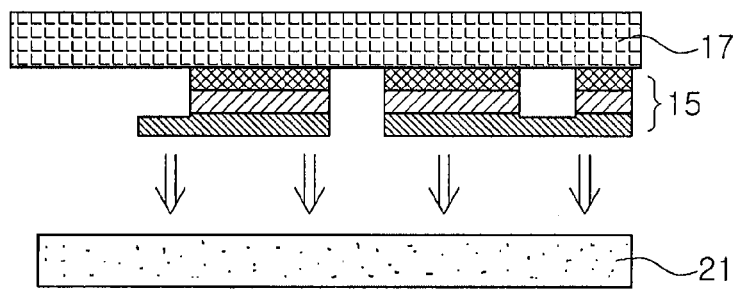

As described in FIG. 3D, the thin film device joined to the supporting structure 17 is joined to a second substrate 21.

The terms, "a second substrate" and "a permanent substrate" refer to a substrate used as a place to be transcribed, which corresponds to a substrate including the thin film device. In this process, the thin film device 15 and the second substrate 21 are joined to each other so as to have higher junction strength than the strength of the temporary junction between the supporting structure 17 and the thin film device 15. For this, according to this embodiment of the present invention, the junction between the thin film device 15 and the second substrate 21 may use a separate junction material layer 22.

More specifically, after a junction material including a precursor having stronger junction strength than the junction strength between the thin film device 15 and the supporting structure 17 is coated, the thin film device may be joined.

On the other hand, the sacrifice layer 13 may not be completely removed, thereby to cause a fine residue to remain on a separated surface of the thin film device 15. However, after the separated surface of the thin film device 15 does not come into direct contact with the second substrate 21 but is temporarily joined to the supporting structure 17, a temporary supporting structure, the separated surface where the residue may exist is joined to the second substrate 21. Accordingly, a limitation of contaminating the surface with the residue of the sacrifice layer 13 can be overcome.

Figure 3E:
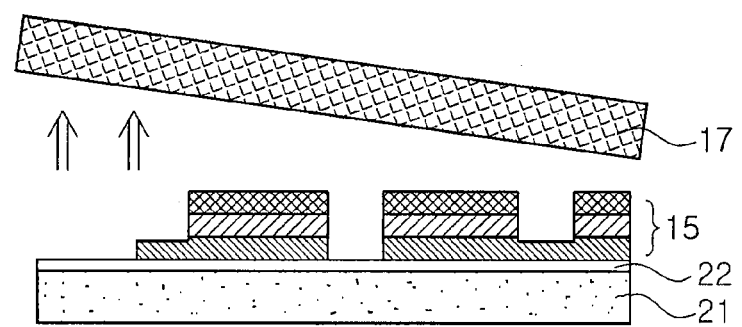

As described in FIG. 3E, the supporting structure 17 is separated from the thin film device 15.

As described above, because the thin film device 15 is joined to the second substrate with relatively higher junction strength through the junction material layer 22, the supporting structure 17 having relatively lower junction strength with respect to the thin film device 15 can be readily separated from the thin film device 15. Specially, if the supporting structure 17 and the thin film device 15 are temporarily joined to each other by van der Waals forces, the separated surface of the thin film device 15 separated from the supporting structure 17 can be maintained very clean.

This thin film transcription technology may be wide used for various thin film devices. More specifically, the thin film transcription technology can be effectively used when a substrate used in a device has a low heat-resisting property or low softening point and melting points though a relatively high temperature process is required like a semiconductor film formation technology. Specially, the thin film transcription technology can also be beneficially used in a flexible thin film device.

In this case, the second substrate 21 may be a flexible substrate formed of a polymer material. The thin film device 15 may be a device formed of an inorganic material such as poly silicon, or a metal. For example, the thin film device 15 may include a TFT, a solar cell, and a biosensor.

According to the embodiment of the present invention, by providing a surface of a thin film or a thin film pattern joined to a permanent substrate as a separated surface, it is possible to omit a process of removing a residue of a sacrifice layer, and to overcome a limitation cause by the residue.

Also, an adhesion between a thin film structure and a substrate and a variation of device property caused by a laser irradiation can be minimized in a process of removing a sacrifice layer from a thin film device manufactured through interconnection and semiconductor processes and transcribing the thin film device to a desired substrate (e.g., a flexible substrate).

In addition, since a change process of junction surface using a supporting structure can be readily implemented not through a separate junction layer but a material interfacial interaction such as van der Waals forces, the entire process can be simplified.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of fabricating a thin film device, comprising:
    forming a sacrifice layer on a first substrate;
    forming a thin film laminated body on the sacrifice layer;
    forming a separation groove exposing the sacrifice layer to divide the thin film laminated body into at least one thin film device;
    partially removing the sacrifice layer using a dry etching process, a remaining sacrifice layer region after the partial removal of the sacrifice layer maintaining the thin film device on the first substrate;
    temporarily joining a supporting structure to the thin film device;
    separating the thin film device joined to the supporting structure from the first substrate, the remaining sacrifice layer region being removed;
    joining the thin film device joined to the supporting structure to a second substrate; and
    separating the supporting structure from the thin film device.

2. The method of fabricating a thin film device according to claim 1, wherein the sacrifice layer is formed of amorphous silicon.

3. The method of fabricating a thin film device according to claim 2, wherein the dry etching process is performed using a $Xe_2F$ gas as an etchant.

4. The method of fabricating a thin film device according to claim 1, further comprising forming an insulating layer on the upper surface of the first substrate to protect the first substrate before the forming of the sacrifice layer.

5. The method of fabricating a thin film device according to claim 4, wherein the insulating layer comprises an oxide or a nitride.

6. The method of fabricating a thin film device according to claim 1, further comprising forming an insulating layer on the sacrifice layer to support the thin film device before the forming of the thin film laminated body.

7. The method of fabricating a thin film device according to claim 5, wherein the insulating layer comprises an oxide or a nitride.

8. The method of fabricating a thin film device according to claim 1, wherein the temporary joining of the supporting structure comprises pressing the supporting structure on the thin film device to temporarily join the surface of the supporting structure to the surface of the thin film device.

9. The method of fabricating a thin film device according to claim 8, wherein the supporting structure is formed of a poly dimethyl siloxane (PDMS)-based or a silicon rubber-based polymer.

10. The method of fabricating a thin film device according to claim 1, wherein the separating of the thin film device comprises irradiating a laser to decompose the remaining sacrifice layer region.

11. The method of fabricating a thin film device according to claim 1, wherein the separating of the thin film device comprises applying a physical force to break the remaining sacrifice layer region to separate the thin film device from the first substrate.

12. The method of fabricating a thin film device according to claim 1, wherein the joining of the thin film device comprises using a junction material layer to join the thin film device to the second substrate.

13. The method of fabricating a thin film device according to claim 1, wherein the second substrate comprises a flexible substrate.

14. The method of fabricating a thin film device according to claim 1, wherein the thin film device comprises a thin film transistor (TFT), a solar cell, or a biosensor.

* * * * *